(12) United States Patent
Reinmuth et al.

(10) Patent No.: US 8,659,099 B2
(45) Date of Patent: Feb. 25, 2014

(54) METHOD FOR MANUFACTURING A MICROMECHANICAL STRUCTURE, AND MICROMECHANICAL STRUCTURE

(75) Inventors: Jochen Reinmuth, Reutlingen (DE); Heribert Weber, Neurtingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/586,576

(22) Filed: Aug. 15, 2012

(65) Prior Publication Data

US 2013/0043548 A1    Feb. 21, 2013

(30) Foreign Application Priority Data

Aug. 16, 2011    (DE) .................. 10 2011 080 978

(51) Int. Cl.
*H01L 29/84* (2006.01)

(52) U.S. Cl.
USPC ............... 257/417; 438/33; 438/48; 438/50; 438/51; 438/53

(58) Field of Classification Search
USPC ........... 257/417, E21.002, E29.324, 414, 415, 257/416
See application file for complete search history.

(56) References Cited

U.S. PATENT DOCUMENTS

| | | | |
|---|---|---|---|
| 2007/0042521 A1* | 2/2007 | Yama | 438/48 |
| 2008/0122560 A1* | 5/2008 | Liu | 333/247 |
| 2008/0290430 A1* | 11/2008 | Mahadevan et al. | 257/418 |

FOREIGN PATENT DOCUMENTS

| | | |
|---|---|---|
| DE | 195 37 814 | 4/1997 |
| DE | 199 61 578 | 6/2001 |

* cited by examiner

*Primary Examiner* — Chuong A Luu
*Assistant Examiner* — Rodolfo Fortich
(74) *Attorney, Agent, or Firm* — Kenyon & Kenyon LLP (57) ABSTRACT

A method for manufacturing a micromechanical structure includes: forming a first insulation layer above a substrate; forming a first micromechanical functional layer on the first insulation layer; forming multiple first trenches in the first micromechanical functional layer, which trenches extend as far as the first insulation layer; forming a second insulation layer on the first micromechanical functional layer, which second insulation layer fills up the first trenches; forming etch accesses in the second insulation layer, which etch accesses locally expose the first micromechanical functional layer; and etching the first micromechanical functional layer through the etch accesses, the filled first trenches and the first insulation layer acting as an etch stop.

16 Claims, 9 Drawing Sheets

METHOD FOR MANUFACTURING A MICROMECHANICAL STRUCTURE, AND MICROMECHANICAL STRUCTURE

BACKGROUND OF THE INVENTION

1. Field of the Invention

The invention relates to a method for manufacturing a micromechanical structure, and to a micromechanical structure.

2. Description of the Related Art

Although it is applicable to any micromechanical components, the present invention and its underlying problem will be explained with reference to acceleration and rotation rate sensors.

Published German patent application document DE 195 37 814 A1 discloses a method for manufacturing micromechanical sensors, for example acceleration and rotation rate sensors. Movable silicon structures, whose motions are sensed quantitatively by determining capacitance changes, are generated. The movable silicon structures are generated in an etching step, trenches being generated with a high aspect ratio in the silicon layer. In a second step a sacrificial layer, for example an oxide layer, is removed from beneath the micromechanical functional layer made of silicon. In a subsequent process the movable silicon structures thereby obtained are hermetically closed off, for example with a cap wafer that is applied using a seal-glass soldering process.

Published German patent application document DE 199 61 578 A1 discloses the generation, directly on a base wafer by way of further process steps, of a cap over the movable sensor surfaces. For this, a layer of oxide is applied on the base wafer, on which the movable silicon structures have already been etched but the sacrificial layer has not yet been removed. The thickness of this oxide layer is small compared with the thickness of the micromechanical functional layer. The oxide layer must, however, close off the trenches, and for this reason it is possible to provide only narrow trenches. A layer that is transparent to the medium used for sacrificial layer etching, for example a thick polysilicon layer into which very narrow holes are etched, is applied onto the oxide layer. The cover layer having thereby been made transparent, all sacrificial layers located therebeneath are then removed in order to make the silicon structures movable. In a final step, the cover layer is hermetically sealed with a further oxide layer or metal layer or polysilicon layer. Only movable structures having relatively little freedom of movement can be arranged beneath the cover layer.

A situation similar to that relating to the closing off of deep, broader structures also exists in the region of the actual movable structures. If a movable structure is arranged over a buried conductive path, an edge in the movable structure also occurs, because of the manufacturing method, at edges in the buried conductor path. This structure can strike against the edge of the buried conductor path and damage it. To prevent this, bumps can be generated in the movable structure by way of an additional sacrificial layer. The movable structure then, with its bumps, strikes against the conductor areally at defined positions, but freedom of movement is thereby further limited. This concept functions, however, only if the buried conductor path is thinner than the sacrificial layer.

This situation also exists when two movable structures are to be disposed one above another, or when a conductor path plane is to be used over a movable structure. In such cases it is usually necessary to design the movable structures to be thicker than the sacrificial layer.

BRIEF SUMMARY OF THE INVENTION

The idea on which the present invention is based is that of providing, after formation of the first functional layer, firstly for a patterning of the first functional layer, in which only very narrow trenches are trenched into the functional layer. The trenches are embodied to be sufficiently narrow that they can subsequently be filled up by the first insulation layer.

The first insulation layer is then patterned, once again only narrow holes and/or lands being generated as etch accesses. The regions between the filled trenches can then be completely etched via an isotropic etching process. The trenches filled with the insulation material, or the lands made of insulation material, serve in this context on the one hand laterally as an etch stop layer, and on the other hand as stabilization for the thin oxide layer located thereabove, if the latter is to be extended out over large areas. With the further deposition of a second thin insulation layer, the narrow etch accesses in the first insulation layer are then preferably closed off again. The two insulation layers serve, during subsequent execution of the process, as an electrical insulation layer and as a sacrificial layer, respectively.

The manufacturing method according to the present invention for a micromechanical structure, with which method it is possible to etch a first micromechanical functional layer, by way of narrow etch accesses, in such a way that recesses which have a substantially greater width than the etch accesses located thereabove can also be formed therein, allows low edge loss.

Large open areas can be generated in the first micromechanical functional layer, it being necessary only to close off the narrow etch accesses before a further functional layer is deposited. The method does not generate topography effects in the subsequent planes, and the use of thin first micromechanical functional layers. The conformation and extent of the recesses in the first micromechanical functional layer is variable over a wide range.

The recesses can have, for example, a width from typically 0.8 μm to 30 μm. Smaller widths (0.8 to 5 μm) are necessary for acceleration sensors and for the electrode regions of rotation rate sensors. Recesses up to 30 μm wide are necessary for the vibrating structure of rotation rate sensors, and can be manufactured in the same process.

BRIEF DESCRIPTION OF THE DRAWINGS

FIG. 4 shows a schematic planar depiction to explain a disposition of etch stop trenches in the first micromechanical functional layer, and etch access trenches in the first insulation layer, in the context of a method for manufacturing a

DETAILED DESCRIPTION OF THE INVENTION

In the Figures, identical reference characters refer to identical or functionally identical elements.

FIGS. 1a to 1j are schematic cross-sectional views to explain a method for manufacturing a micromechanical structure in accordance with a first embodiment of the present invention.

Figure 1A:
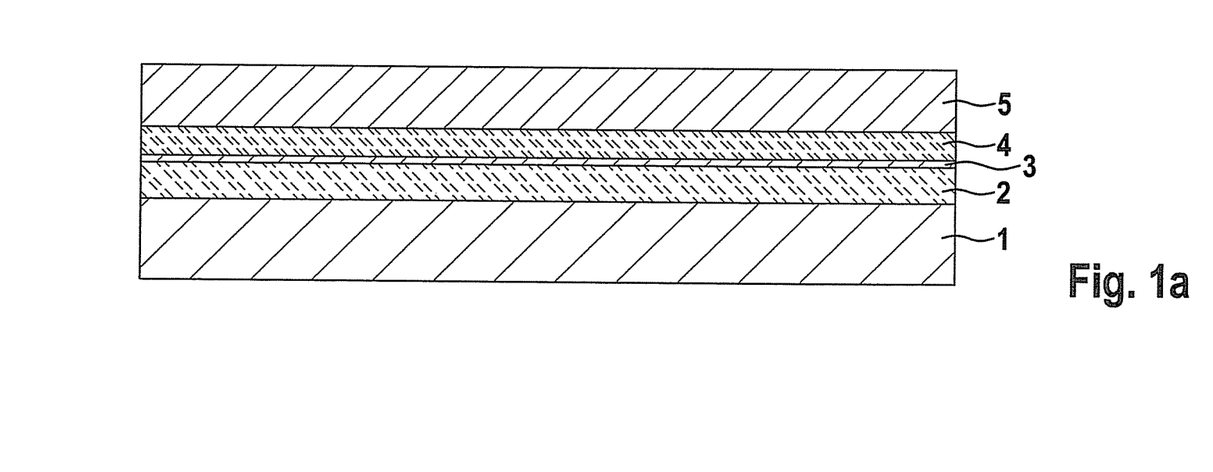
FIGS. 1a to 1j show schematic cross-sectional views to explain a method for manufacturing a micromechanical structure in accordance with a first embodiment of the present invention.

Referring to FIG. 1a, a base insulation layer 2 is deposited over a silicon substrate 1. This base insulation layer 2 can now optionally be patterned in order to, for example, connect the next functional plane thereabove to substrate 1. Optionally, one or more functional layers 3, for example made of polysilicon, can then be deposited and patterned. As process execution continues, a first insulation layer 4 is then deposited on this or these functional layer(s) 3. This first insulation layer 4 serves, as execution continues, as a sacrificial layer or insulation layer or anchoring layer. First insulation layer 4 can of course also optionally be patterned in order to create electrical and/or mechanical contact with the next functional layer located thereabove.

As process execution continues, first micromechanical functional layer 5 is deposited on first insulation layer 4. This can be done, for example, using an LPCVD method or in a combined method with an LPCVD starting layer and an epitaxic layer of polysilicon located thereabove. First micromechanical functional layer 5 made of polysilicon can then optionally be planarized using a polishing method (chemical-mechanical polishing, CMP). This may be necessary, depending on the substructure or thickness of first micromechanical functional layer 5, in order to obtain sufficiently good lithographic resolution in the subsequent step.

Figure 1B:
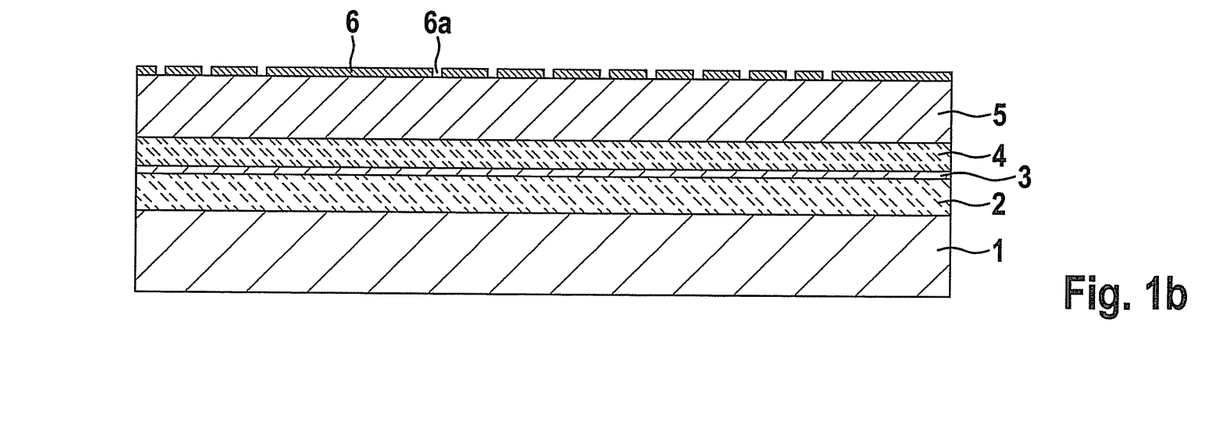

Referring further to FIG. 1b, a resist mask 6 is provided over first micromechanical functional layer 5, said mask having openings 6a with which, in a subsequent process step, the polysilicon therebeneath of first micromechanical functional layer 5 will be trenched.

Figure 1C:
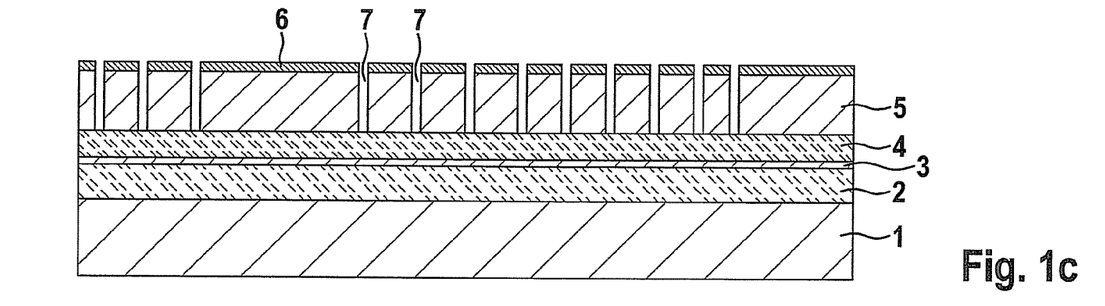

FIG. 1c shows the state of the process after performance of the trenching step, in which narrow first trenches 7, extending as far as first insulation layer 4, are formed in first micromechanical functional layer 5.

The maximum width of the narrow trenches 7 or holes (not depicted) is selected in such a way that the holes or trenches 7 can be closed off again by a further deposition (to be described later).

Figure 1D:
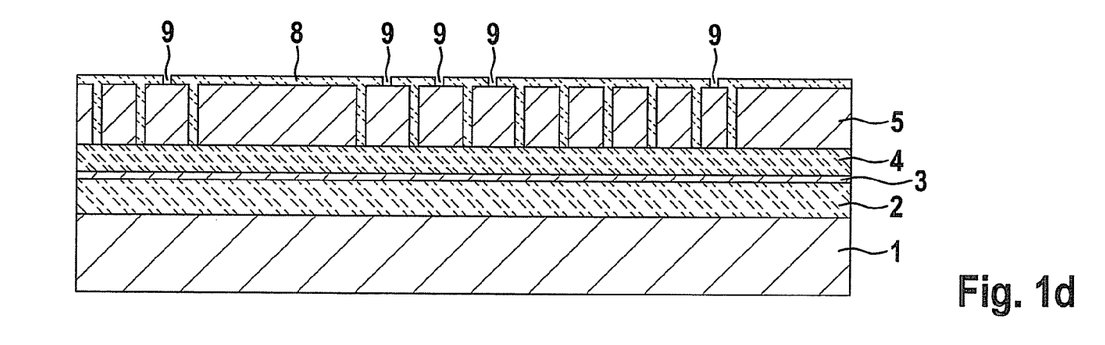

As depicted in FIG. 1d, a second insulation layer 8 is deposited on first micromechanical functional layer 5 after the formation of first trenches 7. Preferably, micromechanical functional layer 5 can first be thermally oxidized, since such oxide layers are very well sealed later in terms of etching attack, e.g. in plasma using $SF_6$. After a pre-oxidation of this kind, a further oxide layer, for example, is applied to the desired target thickness by LPCVD-TEOS deposition. By selecting a CVD oxide for thickening and for completely filling up first trenches 7 it is possible to avoid, specifically in deep trenches, excessive stress in first micromechanical functional layer 5, since with a CVD oxide it is possible to adjust the stress over a wide range with respect to a thermal oxide by appropriate selection of the system parameters. Both compression-stressed and tension-stressed oxide layers can be deposited here, enabling design leeway in terms of the stress configuration of the oxide layer.

Etch accesses 9, which locally expose first micromechanical functional layer 5, are then formed in second insulation layer 8. The width of these first etch accesses 9 is selected in such a way that they can be completely closed off again by an oxide deposition operation (yet to be described) performed later.

Figure 1E:
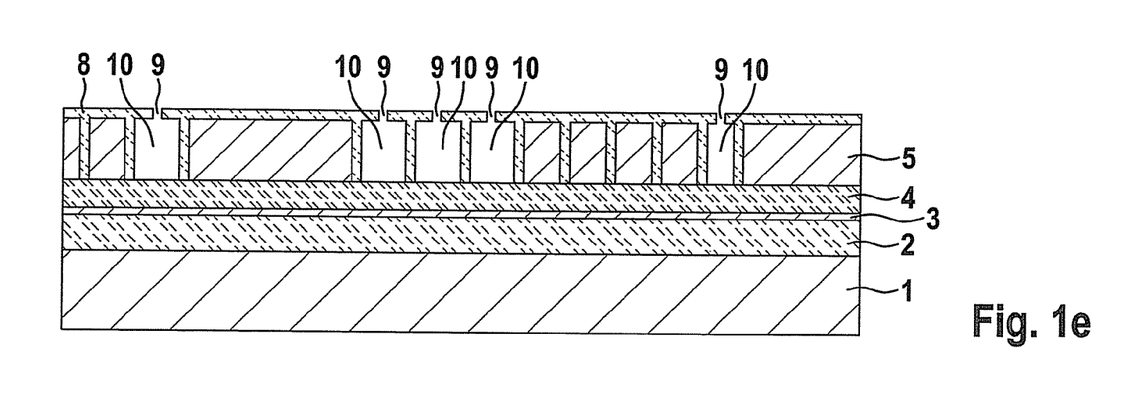

As depicted in FIG. 1e, recesses 10 are then etched into first micromechanical functional layer 5 in an etching step. Isotropic methods are preferably utilized for this. The gas phase method has proved particularly favorable for this, since it can be difficult to rinse out liquid etching media from the under-etched regions through the narrow first etch accesses 9. An exemplifying method is an etching process using $SF_6$ in a plasma, or using $ClF_3$ or $XeF_2$. In the context of this etching of the first micromechanical functional layer, the oxide-filled first trenches 7 and first insulation layer 4 located therebelow serve as an etch stop. In other sub-regions, etching of the polysilicon of first micromechanical functional layer 5 can be limited by way of the etching time. In addition, second insulation layer 8 (made of oxide) deposited into the narrow trenches 7 can serve to stabilize this layer. With large areas of this kind, it is additionally favorable to embody etch accesses 9 in second insulation layer 8 in such a way that stress in that layer can be dissipated by the geometrical disposition of the etch accesses. For example, a meander-like disposition of etch accesses 9 can be used, or long, mutually offset etch accesses 9 (see FIG. 2).

Figure 1F:
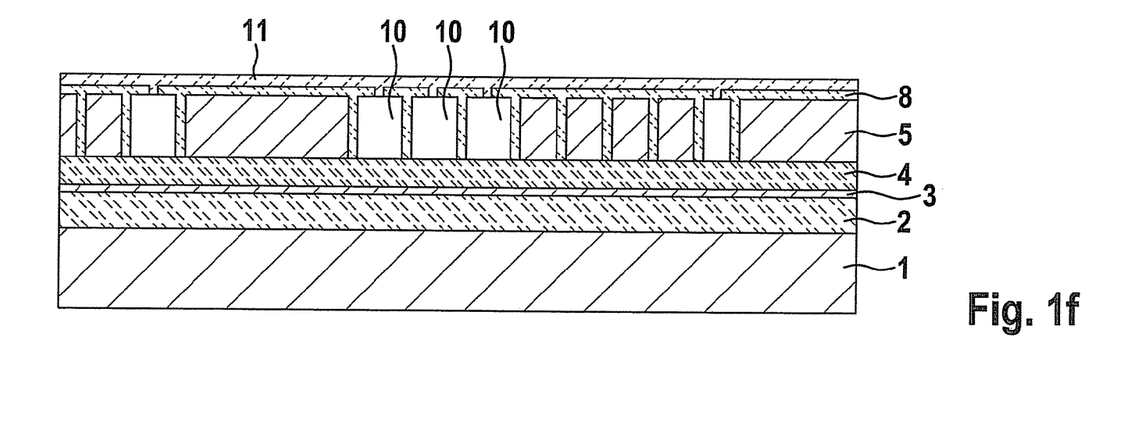

Referring further to FIG. 1f, deposition of a third insulation layer 11 of oxide occurs in order to close off etch accesses 9 in second insulation layer 8. Second insulation layer 8 and third insulation layer 11 together form a further sacrificial and insulation layer. The manufacturing method described here does not, in particular, result in the creation of any substantial topography at sites at which first micromechanical functional layer 5 has been etched.

In a further embodiment (not depicted), second insulation layer 8 is polished back in order to ensure complete closure of etch accesses 9 upon deposition of third insulation layer 11.

Figure 1G:
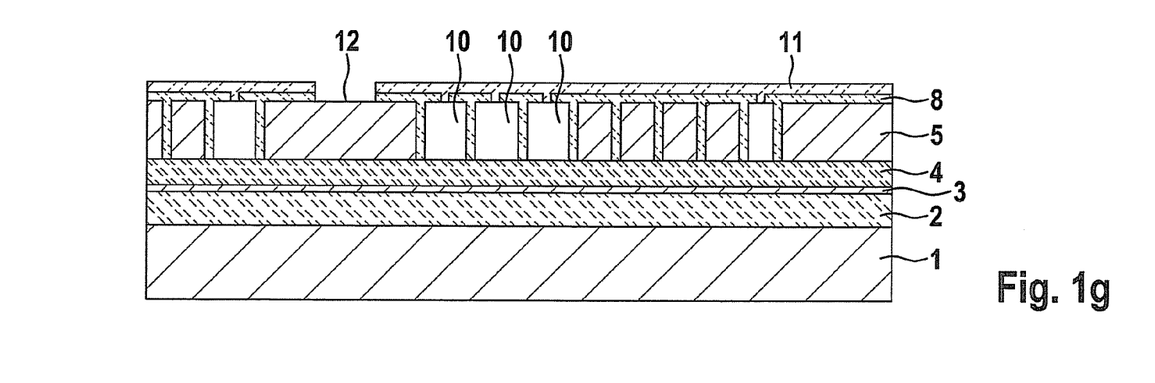
Figure 1H:
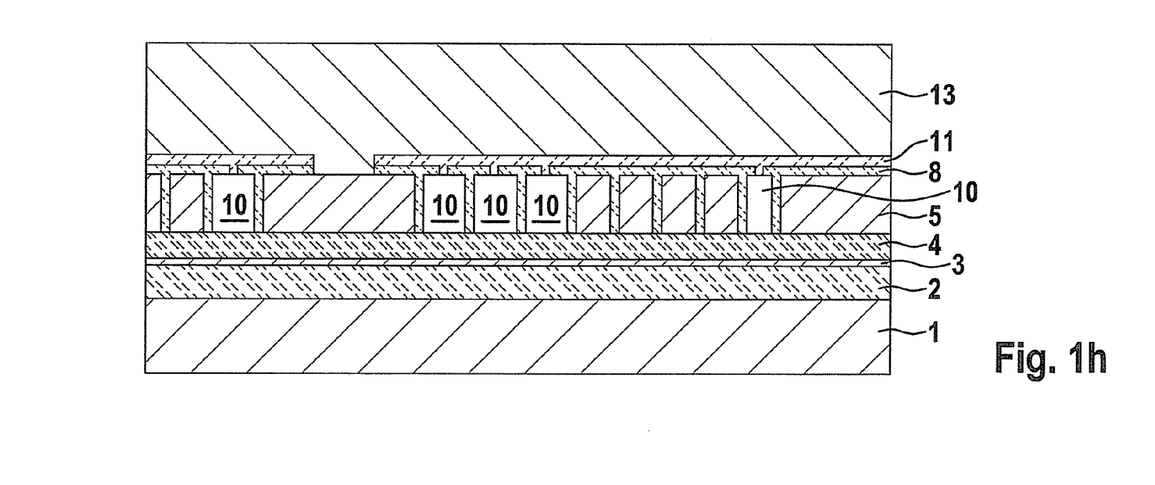

As depicted in FIG. 1g, one or more contact regions 12 of first micromechanical functional layer 5 are then exposed by removing second insulation layer 8 and third insulation layer 11 at the relevant locations by way of an etching process. Contact regions 12 of this kind define connections to a further micromechanical functional layer 13 of polysilicon which is to be deposited later and which is then, as depicted in FIG. 1h, deposited over the resulting structure.

Figure 1I:
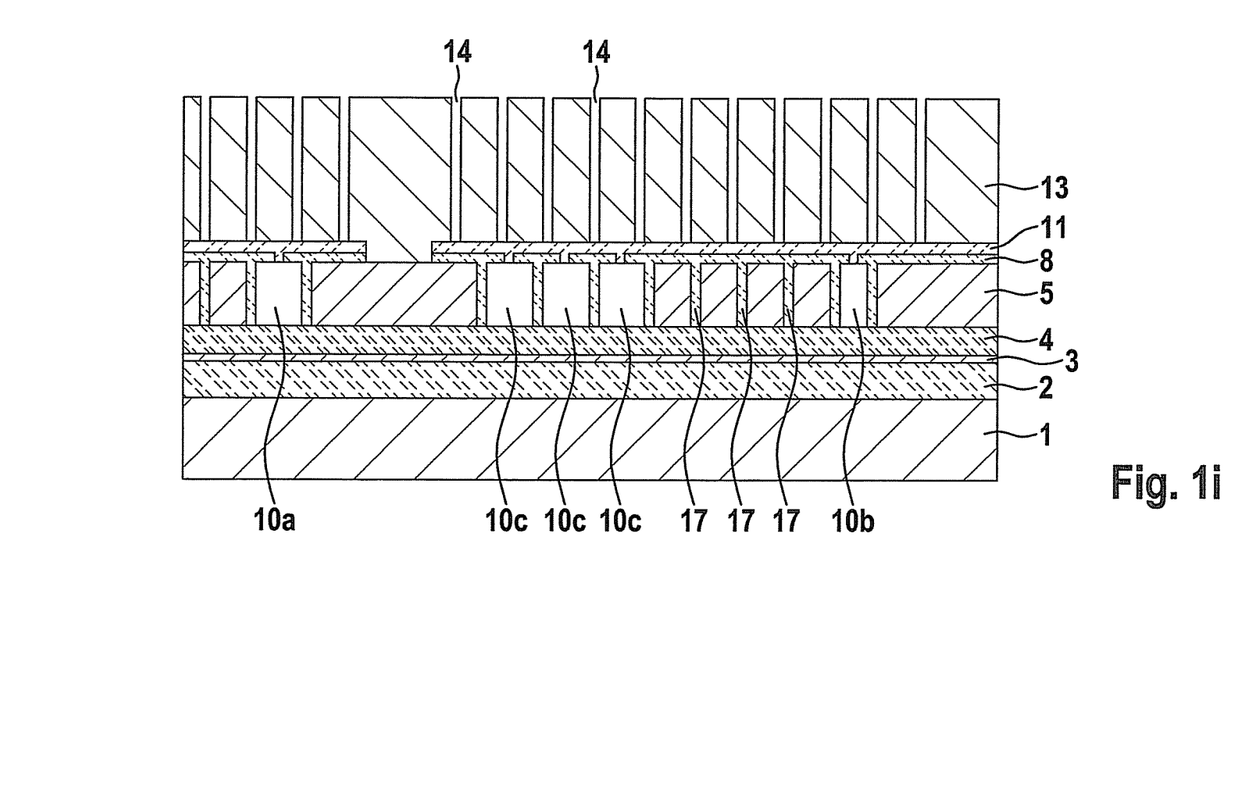

In a manner known per se, second micromechanical functional layer 13 is then patterned in order to form second etch accesses 14 in second micromechanical functional layer 13, which locally expose third insulation layer 11, as depicted in FIG. 1i.

Figure 1J:
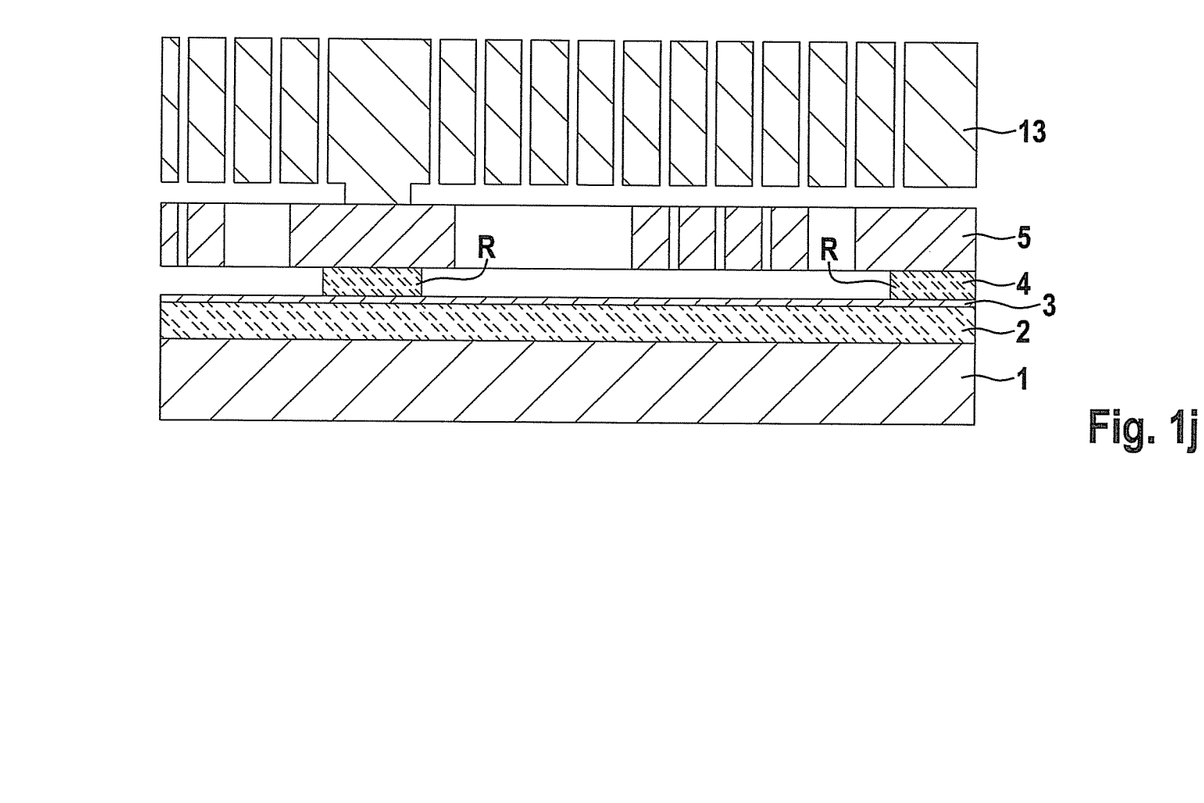

Lastly, referring to FIG. 1j, a further etching process takes place in order to remove second and third insulation layers 8, 11 completely, and to remove first insulation layer 4 except for residual regions R at which first micromechanical functional layer 5 is anchored on substrate 1. This process state corresponds to the state shown in FIG. 1j. In addition, a cover layer (not depicted) can also be deposited, or a combination of further functional layers and/or cover layers.

Figure 2:
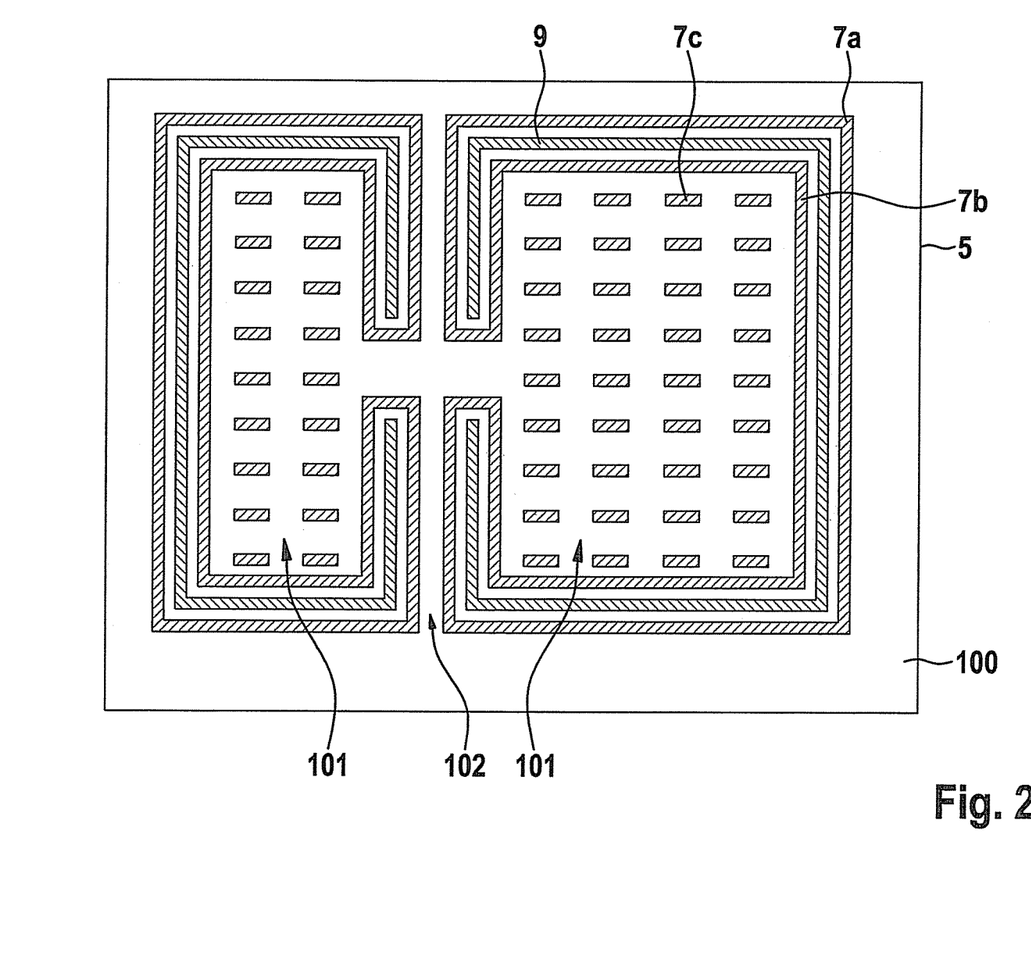
FIG. 2 shows a schematic planar depiction of a Z sensor having an asymmetrical rocker that is manufactured by the method according to FIGS. 1a to 1j.

FIG. 2 is a schematic planar depiction of a Z sensor having an asymmetrical rocker which is manufactured using the method according to FIGS. 1a to 1j.

In FIG. 2, reference character 100 designates a Z sensor to be formed in first micromechanical functional layer 5, having a rocker 101 having an asymmetrical mass distribution and a torsion spring 102 anchored on substrate 1. Etch accesses 7, which, for example, should be very narrow in a Z sensor of this kind in order to ensure a high level of damping, can easily be manufactured with the method according to the present invention. Typical hole and slot widths from 0.2 to 2 μm can be achieved. These structures are patterned only by the first etching step, and are then closed off with the manufacture of second and third insulation layer 8, 11.

Etch stop trenches 7a, 7b make possible removal of first micromechanical functional layer 5 over a large area; reference character 9 indicates the etch accesses for polysilicon etching. In order to obtain a stable second insulation layer 8, large regions can be stabilized with additional support points. It is useful to configure these support points either as a periodically repeating dot pattern or as a pattern of lands.

Figure 3A:
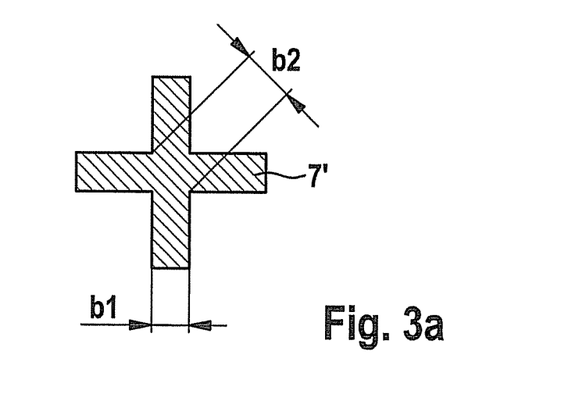
FIGS. 3a to 3c show various embodiments of shapes of etch stop trenches in the first micromechanical functional layer in the context of the method for manufacturing a micromechanical structure in accordance with the first embodiment of the present invention.
Figure 3B:
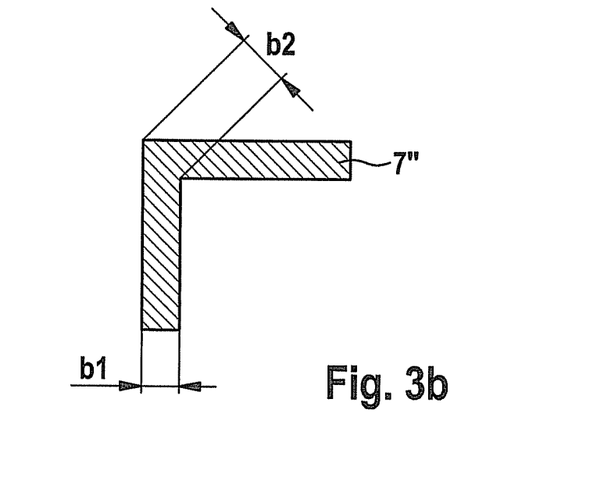
Figure 3C:
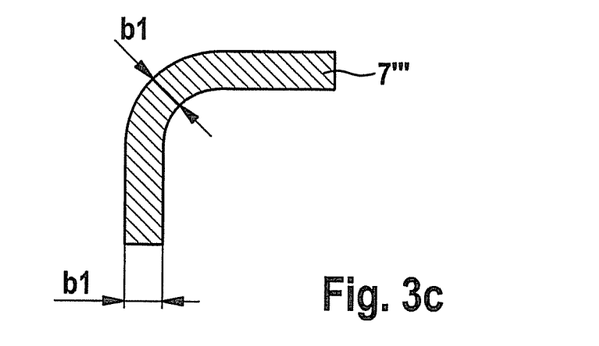

FIGS. 3a to 3c show various embodiments of shapes of etch stop trenches in the first micromechanical functional layer in the context of the method for manufacturing a micromechanical structure in accordance with the first embodiment of the present invention.

All the etch stop trenches 7 that are etched in first micromechanical functional layer 5 before the deposition of second insulation layer 8 should preferably be designed in such a way that T-intersections (FIG. 3a) or angled edges (FIG. 3b) are avoided. Such T-intersections or analogous X-intersections according to FIG. 3a for etch stop trenches 7' have different widths b1, b2 at the intersection points and along the arms. The same applies to angled edges for etch stop trenches 7" according to FIG. 3b.

In addition, the trenching process causes at angled edges of this kind a widening of the trenches as a result of the locally larger open area. The two effects can be avoided by using etch stop trenches 7''' in accordance with FIG. 3c.

It is technically possible for all the trenches 7" that are required as etch stop trenches for the polysilicon etching step to be manufactured continuously, without intersection. Care should be taken in this context that trenches 7''' that are designed to support large open areas in first micromechanical functional layer 5 are not connected to the trenches that function as an etch stop.

Figure 4:
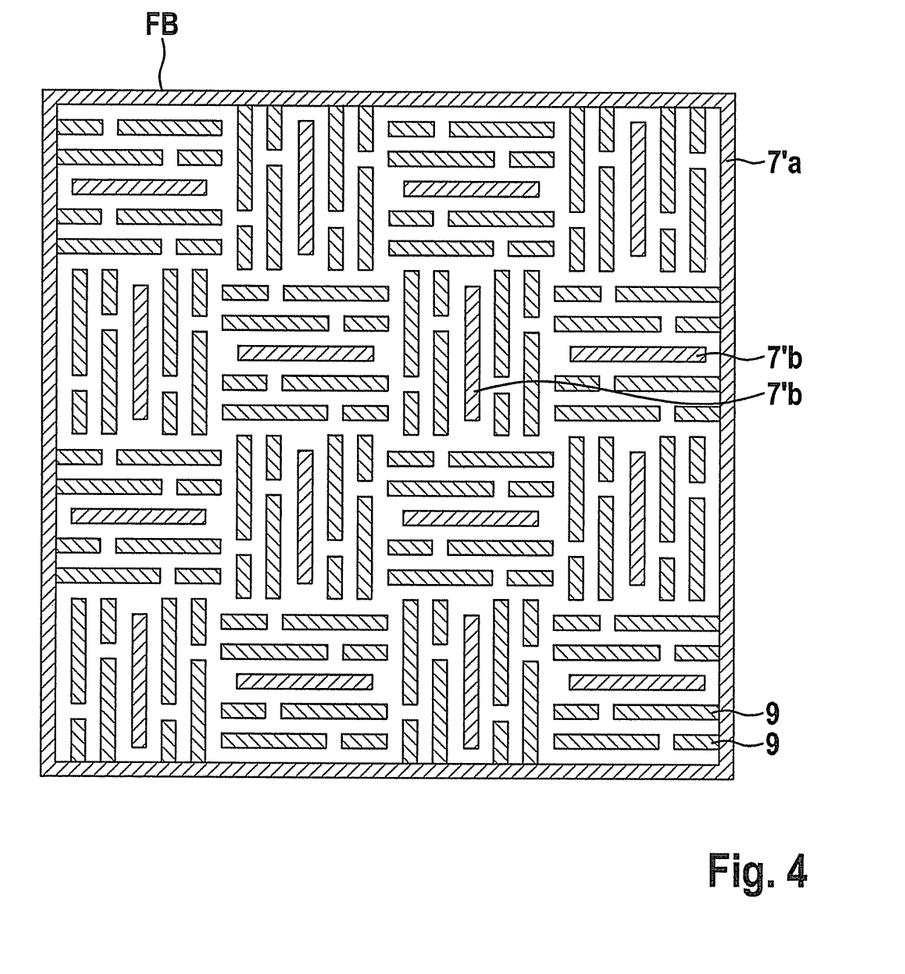

FIG. 4 is a schematic planar depiction to explain a disposition of etch stop trenches in the first micromechanical functional layer and etch access trenches in the first insulation layer, in the context of a method for manufacturing a micromechanical structure in accordance with the further embodiment of the present invention.

FIG. 4 depicts an etch access pattern and etch stop trench pattern for a large-area region FB. Etch stop trench 7'a here is an annularly peripheral etch stop trench, and etch stop lands 7'b are disposed alternatingly perpendicularly to one another.

Etch accesses 9 for polysilicon etching are disposed, in non-intersecting and non-overlapping fashion, between etch stop trenches 7'a, 7'b.

Although the present invention has been explained above with reference to two exemplifying embodiments, it is not limited thereto but instead can be varied in many ways.

The micromechanical method according to the present invention for manufacturing a micromechanical structure, and the corresponding micromechanical structure, can be used in particular for acceleration sensors or rotation rate sensors.

Although the present invention has been explained with reference to preferred exemplifying embodiments, it is not limited thereto. In particular, the aforesaid materials and topologies are merely exemplifying, and are not limited to the examples explained.

The utilization sectors are also construed broadly, and are not limited to acceleration and rotation rate sensors.

What is claimed is:

1. A method for manufacturing a micromechanical structure, comprising:

forming a first insulation layer above a substrate;
forming a first micromechanical functional layer on the first insulation layer;
forming a plurality of first trenches in the first micromechanical functional layer, wherein the first trenches extend as far as the first insulation layer;
forming a second insulation layer on the first micromechanical functional layer, wherein the second insulation layer fills up the first trenches;
forming a plurality of first etch accesses in the second insulation layer, wherein the first etch accesses locally expose the first micromechanical functional layer; and
etching the first micromechanical functional layer through the etch accesses, wherein the filled first trenches and the first insulation layer act as an etch stop, wherein the first insulation layer is removed except for residual regions of the first insulation layer anchoring the first micromechanical functional layer on the substrate in order to form a movable structure in the first micromechanical functional layer.

2. The method as recited in claim 1, further comprising:
forming a third insulation layer on the second insulation layer after the etching, wherein the third insulation layer closes off the etching accesses.

3. The method as recited in claim 2, further comprising:
forming a second micromechanical functional layer above the third insulation layer;
forming a plurality of second etch accesses in the second micromechanical functional layer, wherein the second etch accesses locally expose the third insulation layer; and
etching the first, second, and third insulation layers selectively with respect to the first and second micromechanical functional layers.

4. The method as recited in claim 3, wherein the second and third insulation layers are removed completely.

5. The method as recited in claim 3, wherein, before the deposition of the second micromechanical functional layer, the second and third insulation layers are patterned in order to expose at least one contact region of the first micromechanical functional layer.

6. The method as recited in claim 2, wherein the second insulation layer is polished back before the formation of the third insulation layer.

7. The method as recited in claim 3, wherein the first trenches are formed at least one of (i) continuously and (ii) without mutual intersections.

8. The method as recited in claim 7, wherein the first trenches have rounded edges.

9. The method as recited in claim 3, wherein, for the formation of the second insulation layer, the first micromechanical functional layer is thermally oxidized and subsequently a CVD oxide deposition is carried out.

10. A micromechanical structure, comprising:
a substrate;
a first insulation layer on the substrate;
a first micromechanical functional layer on the first insulation layer, wherein a plurality of first trenches are provided in the first micromechanical functional layer, the first trenches extending as far as the first insulation layer;
a second insulation layer on the first micromechanical functional layer, wherein the second insulation layer fills up the first trenches; and a plurality of etch accesses provided in the second insulation layer laterally of the first trenches, wherein the etch accesses locally expose the first micromechanical functional layer;

wherein recesses in communication with the etch accesses are provided in the first micromechanical functional layer (i) laterally between the filled first trenches and (ii) vertically between the first insulation layer and the second insulation layer, wherein the first insulation layer includes gaps except for residual regions of the first insulation layer anchoring the first micromechanical functional layer on the substrate as a movable structure over the substrate.

11. The structure as recited in claim 10, further comprising:
a third insulation layer provided on the second insulation layer, wherein the third insulation layer closes off the etch accesses and the recesses.

12. The structure as recited in claim 11, further comprising:
a second micromechanical functional layer provided above the third insulation layer.

13. The method as recited in claim 1, wherein the movable structure is a sensor having a rocker with an asymmetrical mass distribution.

14. The structure as recited in claim 10, wherein the movable structure is a sensor having a rocker with an asymmetrical mass distribution.

15. The method as recited in claim 1, wherein the first trenches have a curved shape.

16. The structure as recited in claim 10, wherein the first trenches have a curved shape.

* * * * *